(12) United States Patent
Jang (10) Patent No.: US 11,205,694 B2
(45) Date of Patent: Dec. 21, 2021

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventor: Joonyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/656,430

(22) Filed: Oct. 17, 2019

(65) Prior Publication Data

US 2020/0052060 A1 Feb. 13, 2020

Related U.S. Application Data

(62) Division of application No. 15/013,899, filed on Feb. 2, 2016, now Pat. No. 10,497,768.

(30) Foreign Application Priority Data

May 19, 2015 (KR) .................. 10-2015-0069790

(51) Int. Cl.
*H01L 29/04* (2006.01)
*H01L 27/32* (2006.01)
*H01L 51/52* (2006.01)

(52) U.S. Cl.
CPC ...... *H01L 27/3276* (2013.01); *H01L 51/5246* (2013.01)

(58) Field of Classification Search
None
See application file for complete search history.

(56) References Cited

U.S. PATENT DOCUMENTS

| 7,999,258 | B2 | 8/2011 | Lee et al. |
| 9,450,034 | B2 | 9/2016 | Lee et al. |
| 9,825,253 | B2 | 11/2017 | Cho et al. |
| 2002/0149730 | A1 | 10/2002 | Jeong et al. |
| 2002/0196393 | A1 | 12/2002 | Tashiro et al. |
| 2005/0200270 | A1 | 9/2005 | Kwak et al. |
| 2007/0164675 | A1* | 7/2007 | Amano ............... H01L 27/3276 313/512 |

(Continued)

FOREIGN PATENT DOCUMENTS

| CN | 101349847 A | 1/2009 |
| CN | 104253241 A | 12/2014 |

(Continued)

*Primary Examiner* — Joseph C. Nicely
*Assistant Examiner* — Lamont B Koo
(74) *Attorney, Agent, or Firm* — Lewis Roca Rothgerber Christie LLP (57) ABSTRACT

An organic light-emitting display apparatus includes a lower substrate having a display area, and a sealing area outside of the display area, an upper substrate facing the lower substrate, a display unit at the display area, a sealing member at the sealing area, and adhering the upper substrate to the lower substrate, a metal pattern layer between the lower substrate and the sealing member, and defining a plurality of through-portions, a first metal layer along an edge of the display unit, and spaced from the metal pattern layer, and a plurality of metal patterns having island shapes between the metal pattern layer and the first metal layer.

9 Claims, 5 Drawing Sheets (56) References Cited

U.S. PATENT DOCUMENTS

| | | |
|---|---|---|
| 2007/0170850 A1 | 7/2007 | Choi et al. |
| 2009/0137178 A1* | 5/2009 | Sakakura ............... H05B 33/04 |
| | | 445/25 |
| 2009/0284883 A1 | 11/2009 | Lee et al. |
| 2009/0310079 A1 | 12/2009 | Chu et al. |
| 2012/0074838 A1* | 3/2012 | Im ...................... H01L 51/5246 |
| | | 313/504 |
| 2014/0049737 A1 | 2/2014 | Nagami |
| 2014/0183458 A1 | 7/2014 | Lee et al. |
| 2015/0021573 A1 | 1/2015 | Kwak |

FOREIGN PATENT DOCUMENTS

| | | |
|---|---|---|
| CN | 104517999 A | 4/2015 |
| JP | 2014-38263 A | 2/2014 |
| KR | 10-2009-0120103 A | 11/2009 |
| KR | 10-2014-0088737 A | 7/2014 |
| KR | 10-2015-0002291 A | 1/2015 |
| KR | 10-2015-0011081 A | 1/2015 |
| KR | 10-2015-0037134 A | 4/2015 |

\* cited by examiner

ORGANIC LIGHT-EMITTING DISPLAY APPARATUS AND METHOD OF MANUFACTURING THE SAME

CROSS-REFERENCE TO RELATED APPLICATION

This application is a divisional of U.S. patent application Ser. No. 15/013,899, filed Feb. 2, 2016, which claims priority to, and the benefit of, Korean Patent Application No. 10-2015-0069790, filed on May 19, 2015, in the Korean Intellectual Property Office, the entire contents of all of which are incorporated herein by reference.

BACKGROUND

1. Field

One or more exemplary embodiments relate to an organic light-emitting display apparatus and a method of manufacturing the same, and more particularly, to an organic light-emitting display apparatus that may increase mechanical strength in a circuit unit outside a display unit (e.g., a display area) of the display apparatus, and may prevent external static electricity from flowing into the circuit unit, and a method of manufacturing the display apparatus.

2. Description of the Related Art

Among display apparatuses, organic light-emitting display apparatuses have drawn attention as next-generation display apparatuses because of their wide viewing angles, high contrast ratio, and fast response times.

In a general organic light-emitting display apparatus, a thin-film transistor (TFT) and organic light-emitting devices are formed on a substrate, and the organic light-emitting devices are configured to emit light by themselves. Organic light-emitting display apparatuses may be used as display units of small products, such as mobile phones, or as display units of large products, such as televisions.

An organic light-emitting display apparatus includes an organic light-emitting device, which includes a pixel electrode, a counter electrode, and an intermediate layer including an emission layer (EML) between the pixel electrode and the counter electrode, and the organic light-emitting device may be used as a display unit in each sub(pixel). A sealing member is outside the display area to seal the display area.

SUMMARY

In a conventional organic light-emitting display apparatus, static electricity may be concentrated between a sealing member and a display area due to a structure for increasing mechanical strength outside the display area, and may flow through a wiring into a circuit unit or a pixel, thereby causing damage or failure, and making it difficult to display a high-quality image.

One or more exemplary embodiments include an organic light-emitting display apparatus that may increase mechanical strength in a circuit unit outside a display unit (e.g., a display area), and may prevent external static electricity from flowing into the circuit unit, and a method of manufacturing the organic light-emitting display apparatus.

Additional aspects will be set forth in part in the description which follows and, in part, will be apparent from the description, or may be learned by practice of the presented embodiments.

According to one or more exemplary embodiments, an organic light-emitting display apparatus includes a lower substrate having a display area, and a sealing area outside of the display area, an upper substrate facing the lower substrate, a display unit at the display area, a sealing member at the sealing area, and adhering the upper substrate to the lower substrate, a metal pattern layer between the lower substrate and the sealing member, and defining a plurality of through-portions, a first metal layer along an edge of the display unit, and spaced from the metal pattern layer, and a plurality of metal patterns having island shapes between the metal pattern layer and the first metal layer.

The metal pattern layer may be at a same layer as the first metal layer.

The plurality of metal patterns may be at a same layer as the first metal layer.

The organic light-emitting display apparatus may further include an electrode power supply line overlapping the plurality of metal patterns and the first metal layer, and the display unit may include a thin-film transistor (TFT), a pixel electrode electrically connected to the TFT, and a counter electrode over an entire surface of the display unit, facing the pixel electrode, and contacting the electrode power supply line.

The electrode power supply line might not overlap the metal pattern layer.

The organic light-emitting display apparatus may further include a second metal layer between the first metal layer and the electrode power supply line, the second metal layer overlapping at least some of the plurality of metal patterns.

The metal pattern layer may be at a same layer as the second metal layer.

Remaining ones of the plurality of metal patterns, which are other than the at least some of the plurality of metal patterns, may be at a same layer as the second metal layer.

The metal pattern layer and the first metal layer may be spaced from each other by a first interval, the metal pattern layer and the second metal layer may be spaced from each other by a second interval that is less than the first interval, and the metal pattern layer and the electrode power supply line may be spaced from each other by a third interval that is less than the second interval.

According to one or more exemplary embodiments, a method of manufacturing an organic light-emitting display apparatus includes preparing a lower substrate having a display area, and a sealing area outside of the display area, forming a display unit at the display area, forming a metal pattern layer, in which a plurality of through-portions are patterned, along the sealing area, forming a first metal layer at an edge portion of the display unit and spaced from the metal pattern layer, forming a plurality of metal patterns between the metal pattern layer and the first metal layer, forming a sealing member at the sealing area, and adhering an upper substrate to the lower substrate using the sealing member.

The forming of the metal pattern layer and the forming of the first metal layer may be concurrent.

The forming of the plurality of metal patterns and the forming of the first metal layer may be concurrent.

The method may further include forming an electrode power supply line on the first metal layer to overlap the plurality of metal patterns and the first metal layer, and the forming of the display unit may include forming a thin-film transistor (TFT), forming a pixel electrode that is electrically connected to the TFT, and forming a counter electrode, which faces the pixel electrode and contacts the counter electrode, over an entire surface of the display unit.

The electrode power supply line might not overlap the metal pattern layer.

The method may further include forming a second metal layer between the forming of the first metal layer and the forming of the electrode power supply line such that the second metal layer overlaps at least a part of the first metal layer and overlaps at least some of the plurality of metal patterns.

The forming of the metal pattern layer and the forming of the second metal layer may be concurrent.

Remaining ones of the plurality of metal patterns, which are other than the at least some of the plurality of metal patterns that overlap the second metal layer, may be formed at a same layer as the second metal layer.

The metal pattern layer and the first metal layer may be spaced from each other by a first interval, the metal pattern layer and the second metal layer may be spaced from each other by a second interval that is less than the first interval, and the metal pattern layer and the electrode power supply line may be spaced from each other by a third interval that is less than the second interval.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
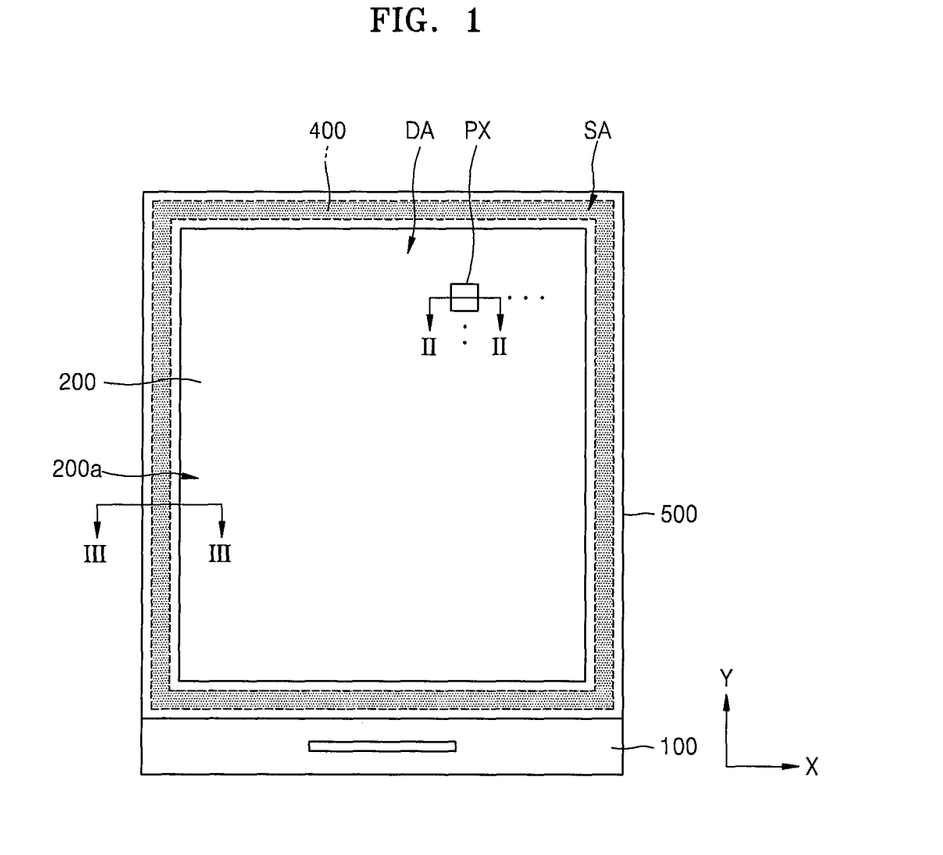
FIG. 1 is a plan view of an organic light-emitting display apparatus according to an exemplary embodiment.
Figure 2:
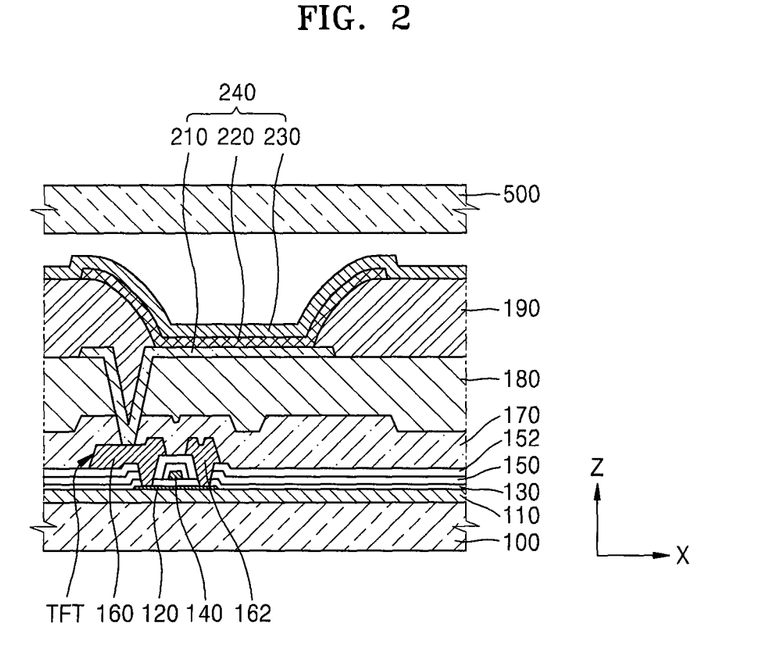
FIG. 2 is a cross-sectional view taken along line II-II of the organic light-emitting display apparatus of FIG. 1.
Figure 3:
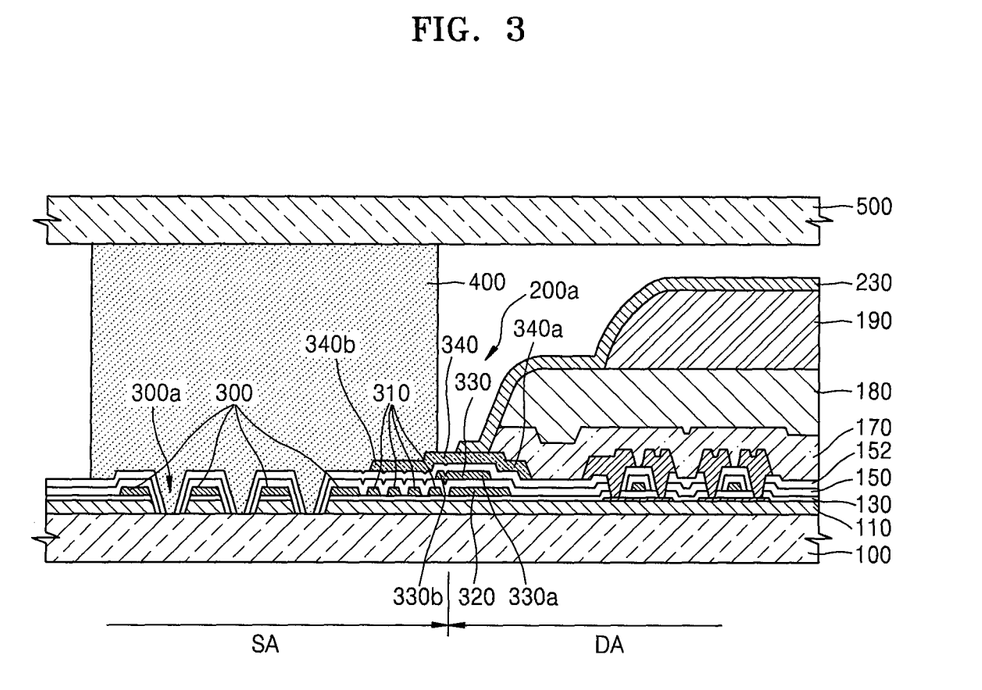
FIG. 3 is a cross-sectional view taken along line III-III of the organic light-emitting display apparatus of FIG. 1.

FIG. 1 is a plan view of an organic light-emitting display apparatus according to an exemplary embodiment, FIG. 2 is a cross-sectional view taken along line II-II of the organic light-emitting display apparatus of FIG. 1, and FIG. 3 is a cross-sectional view taken along line III-III of the organic light-emitting display apparatus of FIG. 1.

Referring to FIGS. 1 through 3, the organic light-emitting display apparatus according to an exemplary embodiment includes a lower substrate 100, a display unit 200 on the lower substrate 100, a metal pattern layer 300, metal patterns 310 on one side of the metal pattern layer 300, a sealing member 400 on the metal pattern layer 300, and an upper substrate 500 that is adhered to the lower substrate 100 by the sealing member 400.

The lower substrate 100 may include any of various materials, for example, a glass material, a metal material, or a plastic material such as polyethylene terephthalate (PET), polyethylene naphthalate (PEN), and/or polyimide. The lower substrate 100 may have a display area DA on which the display unit 200 including a plurality of pixels PX is located, and a sealing area SA that surrounds the display area DA. The upper substrate 500 may include any of various materials, for example, a glass material, a metal material, a plastic material such as PET, PEN, and/or polyimide, like the lower substrate 100. The lower substrate 100 and the upper substrate 500 may include the same material or different materials.

The sealing member 400 may be between the lower substrate 100 and the upper substrate 500. The sealing member 400 may be at the sealing area SA, and the upper substrate 500 may be adhered to the lower substrate 100 by using the sealing member 400 to seal the display unit 200. For example, the sealing member 400 may include, but is not limited to, frit or epoxy.

The display unit 200 may be at the display area DA of the lower substrate 100, and may include the plurality of pixels PX. For example, the display unit 200 may be an organic light-emitting display unit including a plurality of thin-film transistors (TFTs), and a plurality of pixel electrodes connected to respective ones of the TFTs, or may be a liquid crystal display unit. The display unit 200 of the present embodiment is an organic light-emitting display unit. A detailed structure of the display unit 200 is illustrated in FIG. 2.

Referring to FIG. 2, the display unit 200 may include a TFT, a capacitor, and an organic light-emitting device 240 that is electrically connected to the TFT. The TFT may include a semiconductor layer 120 including amorphous silicon, polycrystalline silicon, and/or an organic semiconductor material, and may include a gate electrode 140, a source electrode 162, and a drain electrode 160. A general structure of the TFT will now be explained in detail.

A buffer layer 110 including silicon oxide or silicon nitride may be on the lower substrate 100 to planarize a surface of the lower substrate 100, or to reduce or prevent impurities from penetrating the semiconductor layer 120 of the TFT. The semiconductor layer 120 may be on the buffer layer 110.

The gate electrode 140 is above/over the semiconductor layer 120, and the source electrode 162 and the drain electrode 160 electrically communicate with each other according to a signal applied to the gate electrode 140. The gate electrode 140 may be formed to have a single-layer structure, or may be formed to have a multi-layer structure by using at least one material selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), by taking into account adhesion to an adjacent layer, surface flatness of a stacked layer, and processability.

In the present embodiment, a gate insulating film 130 including silicon oxide and/or silicon nitride may be between the semiconductor layer 120 and the gate electrode 140 to insulate the semiconductor layer 120 from the gate electrode 140.

Interlayer insulating films may be on the gate electrode 140, and may be formed to have a multi-layer structure, as shown in FIG. 2, or may be formed to have a single-layer structure by using a material such as silicon oxide or silicon nitride. As such, when the interlayer insulating films are formed to have a multi-layer structure, the interlayer insulating films may include a lower interlayer insulating film 150 and an upper interlayer insulating film 152.

When the lower and upper interlayer insulating films 150 and 152 have a multi-layer structure as described above, according to another exemplary embodiment, a conductive layer, which partially overlaps the gate electrode 140, may be further provided over the gate electrode 140 according to a structure of a backplane layer including the TFT. The conductive layer may be formed between the lower interlayer insulating film 150 and the upper interlayer insulating film 152, and in this case, the lower interlayer insulating film 150 may function as an insulating film for insulating the gate electrode 140 from the conductive layer. A portion of the conductive layer formed over the gate electrode 140 to overlap the gate electrode 140 may function as a capacitor. That is, the gate electrode 140 under the conductive layer may function as a lower electrode of a capacitor, and the conductive layer over the gate electrode 140 may function as an upper electrode of the capacitor. In this case, the lower interlayer insulating film 150 may function as a dielectric film of the capacitor. However, when the conductive layer is not formed, a second metal layer 330, which will be explained below, may be formed between the lower interlayer insulating film 150 and the upper interlayer insulating film 152.

The source electrode 162 and the drain electrode 160 are above/over the lower and upper interlayer insulating films 150 and 152. The source electrode 162 and the drain electrode 160 may be electrically connected to the semiconductor layer 120 through respective contact holes formed in the lower and upper interlayer insulating films 150 and 152 and in the gate insulating film 130. Each of the source electrode 162 and the drain electrode 160 may be formed to have a single-layer structure, or may be formed to a multi-layer structure by using at least one selected from, for example, Al, Pt, Pd, Ag, Mg, Au, Ni, Nd, Ir, Cr, Li, Ca, Mo, Ti, W, and/or Cu, which may be selected by taking into account conductivity or the like.

A first insulating film 170 that covers the TFT may be on the TFT to protect the TFT constructed as described above, and may include an inorganic material, such as silicon oxide, silicon nitride, and/or silicon oxynitride.

A second insulating film 180 may be above the lower substrate 100, and may be a planarization film. When the organic light-emitting device 240 is over the TFT, the second insulating film 180 substantially planarizes a top surface of the TFT, and protects the TFT and various devices from moisture and impurities. The second insulating film 180 may include, for example, an acrylic organic material and/or benzocyclobutene (BCB). In the present embodiment, as shown in FIG. 2, the buffer layer 110, the gate insulating film 130, the lower and upper interlayer insulating films 150 and 152, the first insulating film 170, and the second insulating film 180 may be formed over an entire surface of the lower substrate 100.

A third insulating film 190 may be formed over the TFT, and may be a pixel-defining film for defining a pixel area. The third insulating film 190 may be on the second insulating film 180, and may have an opening through which a central portion of a pixel electrode 210 is exposed. The third insulating film 190 may be, for example, an organic insulating film. The organic insulating film may include an acrylic polymer such as poly(methyl methacrylate) (PMMA), polystyrene (PS), a polymer derivative having a phenol group, an imide-based polymer, an arylether-based polymer, an amide-based polymer, a fluorine-based polymer, a p-xylene-based polymer, a vinyl alcohol-based polymer, and/or a combination thereof.

The organic light-emitting device 240 may be formed on the second insulating film 180, and may include the pixel electrode 210, an intermediate layer 220 including an emission layer (EML), and a counter electrode 230.

The pixel electrode 210 may be a (semi)transparent electrode or a reflective electrode. When the pixel electrode 210 is a (semi)transparent electrode, the pixel electrode 210 may include, for example, indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is a reflective electrode, the pixel electrode 210 may include a reflective film including Ag, Mg, Al, Pt, Pd, Au, Ni, Nd, Ir, Cr, and/or a compound thereof, and may include a layer including ITO, IZO, ZnO, $In_2O_3$, IGO, and/or AZO. However, the present exemplary embodiment is not limited thereto, and the pixel electrode 210 may include any of various materials, and may have any of various structures, such as a single-layer structure or a multi-layer structure.

Each intermediate layer 220 may be located at the pixel area defined by the third insulating film 190. The intermediate layer 220 may include the EML, which emits light according to an electrical signal, and may further include a hole injection layer (HIL) or a hole transport layer (HTL) between the EML and the pixel electrode 210, and may also include an electron transport layer (ETL) or an electron injection layer (EIL) between the EML and the counter electrode 230. The intermediate layer 220 may have a single-layer structure or a multi-layer stack structure, although the intermediate layer 220 is not limited thereto, and the intermediate layer 220 may have any of various other structures.

The counter electrode 230 that covers the intermediate layer 220 including the EML, and that faces the pixel electrode 210 may be formed over the entire surface of the lower substrate 100. The counter electrode 230 may be a (semi)transparent electrode or a reflective electrode. When the counter electrode 230 is a (semi)transparent electrode, the counter electrode 230 may include a layer including a metal having a low work function such as Li, Ca, LiF/Ca, LiF/Al, Al, Ag, and/or Mg, or a compound thereof, and may include a (semi)transparent conductive layer including ITO, IZO, ZnO, and/or $In_2O_3$. When the counter electrode 230 is a reflective electrode, the counter electrode 230 may include a layer including Li, Ca, LiF/Ca, LiF/Al, Al, Ag, and/or Mg, or a compound thereof. However, a structure and a material of the counter electrode 230 are not limited thereto, and various modifications may be made thereto.

FIG. 3 illustrates both the sealing area SA and an edge portion 200a of the display unit 200 that extends in the display area DA of FIG. 1. Referring to FIG. 3, the buffer layer 110 may be on the lower substrate 100 to extend from the display area DA to the sealing area SA. The gate insulating film 130 may be on the buffer layer 110 to extend from the display area DA to the sealing area SA.

The metal pattern layer 300 may be on the gate insulating film 130 on the sealing area SA. A plurality of through-portions 300a may be patterned in the metal pattern layer 300, to have substantially quadrangular box shapes. Due to the plurality of through-portions 300a formed in the metal pattern layer 300 (and also formed in the gate insulating film 130 and the buffer layer 110), a contact area between the lower substrate 100 and the sealing member 400 on the metal pattern layer 300 may be increased, and thus the sealing member 400 may be more firmly adhered to the lower substrate 100.

Figure 4:
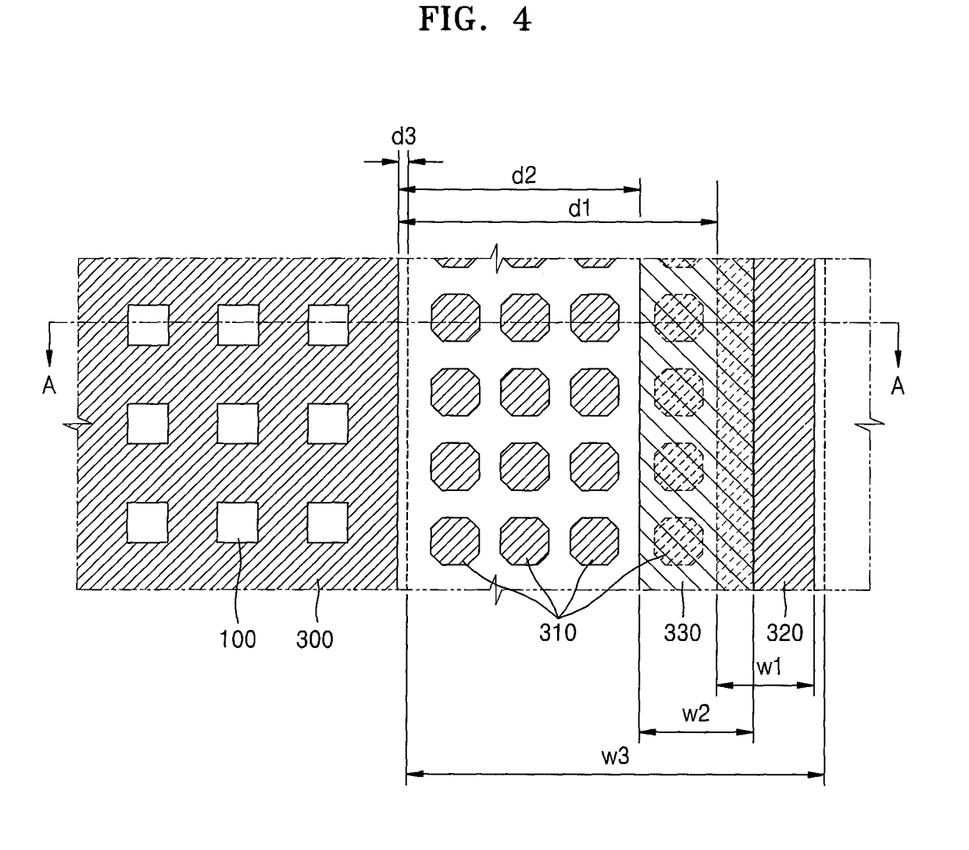
FIG. 4 shows plan views illustrating a structure of FIG. 3.

Although portions of the metal pattern layer 300 are spaced apart/separated from each other by the through-portions 300a, as shown in FIG. 3, the metal pattern layer 300 may be formed as a single layer having the plurality of through-portions 300a, as shown in FIG. 4. The plurality of through-portions 300a of the metal pattern layer 300 may expose the lower substrate 100, and may also expose the buffer layer 110. Also, in other embodiments, fine patterns including an insulating material may be further formed in the through-portions 300a.

Referring to FIG. 3, an electrode power supply line 340 that surface-contacts the counter electrode 230 (e.g., beneath a bottom surface of a tail end of the counter electrode), and that is configured to supply power to the counter electrode 230, may be at an edge of the display unit 200 formed on the display area DA of the lower substrate 100. The electrode power supply line 340 may be located at the edge portion 200a of the display unit 200, and a first metal layer 320 and the second metal layer 330 may be located beneath/under the electrode power supply line 340. As such, effective widths of the first metal layer 320 and the second metal layer 330 that are under the electrode power supply line 340 may increase as a dead space of the organic light-emitting display apparatus decreases, thereby increasing mechanical strength at the edge portion 200a of the display unit 200.

First, the first metal layer 320 may be on the same layer as the metal pattern layer 300 and as the metal patterns 310 (e.g., on the gate insulating film 130). Accordingly, the metal pattern layer 300, the metal patterns 310, and the first metal layer 320 may be on the same layer as the gate electrode 140 of the TFT, and may be formed by using the same mask. The first metal layer 320 may be on the same layer as the metal pattern layer 300, and may be spaced from the metal pattern layer 300 by a given interval.

The plurality of metal patterns 310 may be at the sealing area SA of the lower substrate 100, and may be at an interval area between the metal pattern layer 300 and the first metal layer 320. The metal patterns 310 may be on the gate insulating film 130, like the metal pattern layer 300, and may be located at a side of the metal pattern layer 300 that is adjacent the display unit 200. That is, the metal patterns 310 may be around, or may surround, the display unit 200, and may be formed to have island shapes that are not electrically connected to any device or wiring. The metal patterns 310 may be formed at the interval area between the metal pattern layer 300 and the first metal layer 320, which will be explained below, and may prevent external static electricity from flowing into the display unit 200.

To reduce static electricity flowing into the display unit 200, the metal pattern layer 300 at the sealing area SA may be formed to entirely have an island shape. However, although static electricity flowing into the display unit 200 may be reduced, because temperature non-uniformity in the sealing member 400 may increase during laser sealing of the sealing member 400, it may not be preferable that the metal pattern layer 300 is formed to entirely have an island shape. Accordingly, a width of the first metal layer 320 under the electrode power supply line 340 may be reduced, and the metal patterns 310 may be at the interval area, between the metal pattern layer 300 and the first metal layer 320, which is formed due to the reduction in the width of the first metal layer 320. Accordingly, due to the metal patterns 310 at the interval area, an effective width of the first metal layer 320 may be maintained, and mechanical strength may be increased. Also, the risk of damage due to static electricity may be reduced, due to the reduction in the width of the first metal layer 320, and external static electricity may be reduced or prevented from flowing into the display unit 200.

When the metal pattern layer 300, the metal patterns 310, and the first metal layer 320 are at the same layer, as described above, the lower interlayer insulating film 150 may be on the metal pattern layer 300, on the metal patterns 310, and on the first metal layer 320. The lower interlayer insulating film 150 may also be formed to extend from the display area DA to the sealing area SA.

The second metal layer 330 may be formed over the first metal layer 320, and may be between the first metal layer 320 and the electrode power supply line 340. That is, the second metal layer 330 may be on the lower interlayer insulating film 150, and may overlap at least a part of the first metal layer 320 and at least a part of one or more of the metal patterns 310. That is, the second metal layer 330 may overlap a part of the first metal layer 320, and a portion of the second metal layer 330 that does not overlap the first metal layer 320 may overlap at least some of the metal patterns 310 adjacent the first metal layer 320.

According to another exemplary embodiment, a conductive layer may be further provided to partially overlap the gate electrode 140 according to a structure of a backplane layer including the TFT. The conductive layer may be formed between the lower interlayer insulating film 150 and the upper interlayer insulating film 152. As the second metal layer 330 is formed on the lower interlayer insulating film 150, the conductive layer and the second metal layer 330 may be formed at the same layer and using the same material. However, the present exemplary embodiment is not limited thereto, and in other embodiments, the second metal layer 330 may be separately formed on the lower interlayer insulating film 150 by using an additional mask and without forming the conductive layer.

The upper interlayer insulating film 152 may be on the second metal layer 330. The second metal layer 330 may also be formed to extend from the display area DA to the sealing area SA. The electrode power supply line 340 may be on the upper interlayer insulating film 152, as described above. The electrode power supply line 340 may be formed at the same layer as the source electrode 162 and/or the drain electrode 160 of the TFT at the display area DA, and accordingly, the electrode power supply line 340 may include, but is not limited to, the same material as that of the source electrode 162 or the drain electrode 160. One end 340a of the electrode power supply line 340 may be covered by the first insulating film 170, and the other end 340b of the electrode power supply line 340 may be covered by the sealing member 400.

The electrode power supply line 340 may overlap the first metal layer 320 and the plurality of metal patterns 310, as shown in FIG. 3. In this case, the electrode power supply line 340 may be spaced from the metal pattern layer 300 by a given interval (i.e., the electrode power supply line 340 might not overlap the metal pattern layer 300).

FIG. 4 shows plan views illustrating a structure of FIG. 3. That is, FIG. 4 illustrates a structure that may be formed on the lower substrate 100 before the sealing member 400 is formed, and FIG. 3 may be a cross-sectional view taken along line A-A of FIG. 4.

As described above, the metal pattern layer 300 may be at the sealing area SA of the lower substrate 100. The plurality of through-portions 300a may be patterned in the metal pattern layer 300, and may be patterned to have substantially quadrangular box shapes. Due to the plurality of through-portions 300a formed in the metal pattern layer 300, a contact area between the lower substrate 100 and the sealing member 400 on the metal pattern layer 300 may be increased, and thus the sealing member 400 may adhere more firmly to the lower substrate 100. Also, although not shown in FIG. 4, fine patterns including an insulating material may be further formed in the through-portions 300a. Although the plurality of through-portions 300a formed in the metal pattern layer 300 expose the lower substrate 100 in FIG. 4, the present exemplary embodiment is not limited thereto.

The first metal layer 320 may be at a side of the metal pattern layer 300 that is adjacent the display unit 200, and may be spaced from the metal pattern layer 300 by a first interval d1. The first metal layer 320 may have a first width w1. To maintain an effective width, despite the first width w1 being less than that of a conventional first metal layer, the metal patterns 310 may be formed, as described below. The first metal layer 320 may be located at the edge portion 200a of the display unit 200. Effective widths of the first metal layer 320 and the second metal layer 330, which will be explained below, may increase as a dead space of the organic light-emitting display apparatus decreases, thereby increasing mechanical strength at the edge portion 200a of the display unit 200.

The plurality of metal patterns 310 may be at an interval area between the metal pattern layer 300 and the first metal layer 320. That is, the metal patterns 310 may be at a side of the metal pattern layer 300 that is adjacent the display unit 200.

The metal patterns 310 may have island shapes that are not connected to any device and wiring. In FIG. 4, the metal patterns 310 have octagonal shapes that may be obtained by removing corners of quadrangular shapes. The metal patterns 310 may have any shape, as long as the metal patterns 310 are spaced from one another (e.g., as island shapes). However, to prevent concentration of static electricity on corners of polygonal shapes, it may be preferable that the metal patterns 310 are formed to have polygonal shapes with large interior angles. The metal patterns 310 may have elliptical shapes or circular shapes, instead of polygonal shapes. Due to the metal patterns 310, external static electricity may be prevented from flowing into the display unit 200.

The second metal layer 330 may be formed over the first metal layer 320, and may be spaced from the metal pattern layer 300 by a second interval d2. In the present embodiment, the second interval d2 is less than the first interval d1. The second metal layer 330 may overlap at least a part of the first metal layer 320, and may overlap at least a part of one or more of the metal patterns 310. That is, the second metal layer 330 may overlap the first metal layer 320, and a portion of the second metal layer 330 that does not overlap the first metal layer 320 may overlap at least some of the metal patterns 310 adjacent the first metal layer 320. The second metal layer 330 may have a second width w2, and, as shown in FIG. 3, one end 330a of the second metal layer 330 may overlap a part of the first metal layer 320, and the other end 330b of the second metal layer 330 may overlap some of the metal patterns 310.

The electrode power supply line 340 may have a third width w3, and may be spaced from the metal pattern layer 300 by a third interval d3 to not overlap the metal pattern layer 300. The third interval d3 may be less than the first interval d1. The electrode power supply line 340 may be formed over the second metal layer 330 to overlap the first metal layer 320, the metal patterns 310, and the second metal layer 330.

Due to the metal patterns 310 at the interval area described above, an effective width of the first metal layer 320 may be maintained, and mechanical strength may be increased. Also, the risk of static electricity may be reduced due to a reduction in width (e.g., first width w1) of the first metal layer 320, and external static electricity may be reduced or prevented from flowing into the display unit 200.

Figure 5:
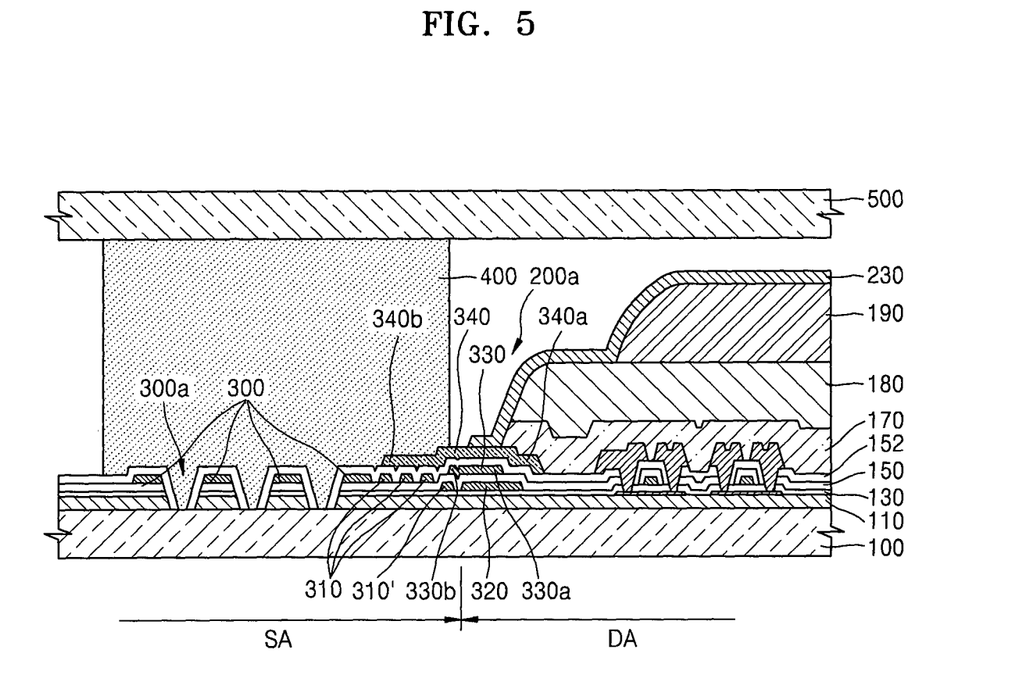
FIG. 5 is a cross-sectional view of an organic light-emitting display apparatus according to another exemplary embodiment.

FIG. 5 is a cross-sectional view of an organic light-emitting display apparatus according to another exemplary embodiment.

Referring to FIG. 5, the buffer layer 110 may be on the lower substrate 100 to extend from the display area DA to the sealing area SA. The gate insulating film 130 may be on the buffer layer 110 to extend from the display area DA to the sealing area SA.

The first metal layer 320 may be on the gate insulating film 130 at the display area DA. The first metal layer 320 may be at the edge portion 200a of the display unit 200, and the second metal layer 330 and the electrode power supply line 340 may be located over the first metal layer 320. In the present embodiment, metal patterns 310' may be at a side of the metal pattern layer 300 that is adjacent the display unit 200. The second metal layer 330 may overlap the metal patterns 310'.

The lower interlayer insulating film 150 may be on the first metal layer 320, and may also extend from the display area DA to the sealing area SA.

The second metal layer 330 may be formed over the first metal layer 320, and may be between the first metal layer 320 and the electrode power supply line 340. That is, the second metal layer 330 may be on the lower interlayer insulating film 150, and may overlap at least a part of the first metal layer 320, and may also overlap at least some of the metal patterns 310'. That is, the second metal layer 330 may overlap a part of the first metal layer 320, and a portion of the second metal layer 330 that does not overlap the first metal layer 320 may overlap at least some of the metal patterns 310 adjacent the first metal layer 320.

According to another exemplary embodiment, a conductive layer may be further provided to partially overlap the gate electrode 140, according to a structure of a backplane structure including the TFT. The conductive layer may be between the lower interlayer insulating film 150 and the upper interlayer insulating film 152. As the second metal layer 330 is formed on the lower interlayer insulating film 150, the conductive layer and the second metal layer 330 may be formed at the same layer by using the same material. However, the present exemplary embodiment is not limited thereto, and the second metal layer 330 may be separately formed at the lower interlayer insulating film 150 by using an additional mask and without forming the conductive layer.

The metal pattern layer 300 that is spaced from the second metal layer 330 by a given interval may be at the sealing area SA of the lower substrate 100. That is, the metal pattern layer 300 may be on the lower interlayer insulating film 150 at the sealing area SA. The plurality of through-portions 300a may be patterned in the metal pattern layer 300 to have substantially quadrangular box shapes. Due to the plurality of through-portions 300a in the metal pattern layer 300, a contact area between the lower substrate 100 and the sealing member 400 on the metal pattern layer 300 may be increased, and thus the sealing member 400 may more firmly adhere to the lower substrate 100.

Although portions of the metal pattern layer 300 that are separated by the through-portions 300a are spaced apart from one another in FIG. 5, the metal pattern layers 300 may be formed as one layer having the plurality of through-portions 300a, as shown in FIG. 4. The plurality of through-portions 300a of the metal pattern layer 300 may expose the lower substrate 100, and may expose the buffer layer 110.

Also, an insulating material (e.g., fine patterns including an insulating material) may be further formed in the through-portions 300a.

The plurality of metal patterns 310 may be at the sealing area SA, and may be at an interval area between the metal pattern layer 300 and the second metal layer 330. The metal patterns 310 may be on the lower interlayer insulating film 150, like the metal pattern layer 300, and may be located at a side of the metal pattern layer 300 adjacent the display unit 200. That is, the metal patterns 310 may be located around the display unit 200, and may be formed to have island shapes that are not electrically connected to any device or wiring. Due to the metal patterns 310, external static electricity may be reduced or prevented from flowing into the display unit 200.

The upper interlayer insulating film 152 may be on the second metal layer 330, and may be formed to extend from the display area DA to the sealing area SA. The electrode power supply line 340 may be on the upper interlayer insulating film 152, as described above. The electrode power supply line 340 may be formed at the same layer as the source electrode 162 and/or the drain electrode 160 of the TFT at the display area DA, and also may include the same material as that of the source electrode 162 and/or the drain electrode 160. One end 340a of the electrode power supply line 340 may be covered by the first insulating film 170, and the other end 340b of the electrode power supply line 340 may be covered by the sealing member 400.

The electrode power supply line 340 may overlap the first metal layer 320, and may overlap the plurality of metal patterns 310, as shown in FIG. 5. In this case, the electrode power supply line 340 may be spaced from the metal pattern layer 300 that is formed under the sealing member 400 by a given interval. That is, the electrode power supply line 340 might not overlap the metal pattern layer 300.

The electrode power supply line 340 that surface-contacts the counter electrode 230, and that supplies power to the counter electrode 230, may be at an edge of the display unit 200 that is at the display area DA. The electrode power supply line 340 may be at the edge portion 200a of the display unit 200, and may be over the first metal layer 320 and the second metal layer 330, as described above. As such, effective widths of the first metal layer 320 and the second metal layer 330 that are under the electrode power supply line 340 may increase as a dead space of the organic light-emitting display apparatus decreases, thereby increasing mechanical strength at the edge portion 200a of the display unit 200.

As such, a width of the first metal layer 320 under the electrode power supply line 340 may be reduced, and the metal patterns 310 may be at the interval area between the first metal layer 320 and the metal pattern layer 300. Accordingly, due to the metal patterns 310 at the interval area, an effective width of the first metal layer 320 may be maintained, and mechanical strength may be increased. Also, the risk of damage due to static electricity is reduced due to the reduction in the width of the first metal layer 320, and external static electricity may be reduced or prevented from flowing into the display unit 200.

Although only an organic light-emitting display apparatus has been described, the inventive concept is not limited thereto. For example, a method of manufacturing an organic light-emitting display apparatus may be included in the scope of the inventive concept. A method of manufacturing an organic light-emitting display apparatus, according to an exemplary embodiment, will now be explained with reference to FIGS. 2 and 3.

Referring to FIGS. 2 and 3, the lower substrate 100 having the display area DA, and the sealing area SA that is outside the display area DA, may be prepared, and the display unit 200 may be formed at the display area DA of the lower substrate 100. A detailed structure of the display unit 200 has been described in a manufacturing order with reference to FIG. 3, and thus a detailed explanation thereof will not be given.

When the display unit 200 is formed, the TFT including the semiconductor layer 120, the gate electrode 140, the source electrode 162, and the drain electrode 160 may be formed. At the same time as the formation of the gate electrode 140 of the TFT, the metal pattern layer 300, the metal patterns 310, and the first metal layer 320 may be formed. Referring to FIG. 3, the gate electrode 140 of the TFT, the metal pattern layer 300, the metal patterns 310, and the first metal layer 320 are formed at the same layer. When elements are formed at the same layer, the elements may be formed using the same process.

The metal pattern layer 300 in which the plurality of through-portions 300a are patterned may be formed along the sealing area SA of the lower substrate 100.

The metal pattern layer 300 may be on a portion of the gate insulating film 130 at the sealing area SA. The plurality of through-portions 300a may be patterned in the metal pattern layer 300 to have substantially quadrangular box shapes. Due to the plurality of through-portions 300a in the metal pattern layer 300, a contact area between the lower substrate 100 and the sealing member 400 on the metal pattern layer 300 may be increased, and thus the sealing member 400 may more firmly adhere to the lower substrate 100. Also, although not shown, insulating material (e.g., fine patterns including an insulating material) may be further formed in the through-portions 300a.

Although the metal pattern layer 300 is formed at the same layer as the gate electrode 140 of the TFT in FIG. 3, the present exemplary embodiment is not limited thereto. According to another exemplary embodiment, referring to FIG. 5, the metal layer 300 may be at the same layer as the second metal layer 330 over the first metal layer 320.

The first metal layer 320 may be formed at the same layer as the metal patterns 310 and the metal pattern layer 300, as shown in FIG. 3, and may be spaced from the metal pattern layer 300 by a given interval.

The plurality of metal patterns 310 may be formed at the sealing area SA of the lower substrate 100, and may be formed at an interval area between the metal pattern layer 300 and the first metal layer 320. The metal patterns 310 may be formed on the gate insulating film 130, like the metal pattern layer 300, and may be located at a side of the metal pattern layer 300 adjacent the display unit 200. The metal patterns 310 may have island shapes that are not electrically connected to any device or wiring. Because of the metal patterns 310, external static electricity may be reduced or prevented from flowing into the display unit 200.

Although the metal patterns 310 are formed at the same time as the first metal layer 320, in the embodiment shown in FIG. 3, the present exemplary embodiment is not limited thereto. According to another exemplary embodiment, referring to FIG. 5, the metal patterns 310 may be at the same layer as the second metal layer 330, which is over the first metal layer 320. In this case, remaining metal patterns 310, not including the metal patterns 310 that are overlapped the second metal layer 330, as shown in FIG. 3, may be formed at the same layer as the second metal layer 330, as shown in FIG. 5.

After the lower interlayer insulating film 150 is formed on the first metal layer 320 and covers the entire surface of the lower substrate 100, the second metal layer 330 may be formed over the first metal layer 320 to overlap a part of the first metal layer 320. The second metal layer 330 may overlap a part of the first metal layer 320 and may overlap at least some of the metal patterns 310. Effective widths of the first metal layer 320 and the second metal layer 330 may increase as a dead space of the organic light-emitting display apparatus decreases, thereby increasing mechanical strength at the edge portion 200a of the display unit 200.

After the upper interlayer insulating film 152 is formed on the second metal layer 330 and covers the entire surface of the lower substrate 100, the electrode power supply line 340 may be formed over the second metal layer 330. The electrode power supply line 340 may be at the edge portion 200a of the display unit 200, and may surface-contact the counter electrode 230, and may supply power to the counter electrode 230. The electrode power supply line 340 may overlap the first metal layer 320, the second metal layer 330, and the metal patterns 310. In the present embodiment, the electrode power supply line 340 may be formed to not overlap the metal pattern layer 300.

Due to the metal patterns 310 on the interval area, as described above, an effective width of the first metal layer 320 may be maintained, and mechanical strength may be increased. Also, the risk of damage due to static electricity may be reduced due to a reduction in a width of the first metal layer 320, and external static electricity may be reduced or prevented from flowing into the display unit 200.

While the inventive concept has been particularly shown and described with reference to exemplary embodiments thereof, they are provided for the purposes of illustration and it will be understood by those of ordinary skill in the art that various modifications and equivalent other embodiments can be made from the inventive concept. Accordingly, the true technical scope of the inventive concept is defined by the technical spirit of the appended claims and their equivalents.

What is claimed is:

1. A method of manufacturing an organic light-emitting display apparatus, the method comprising:
    preparing a lower substrate having a display area, and a sealing area outside of the display area;
    forming a buffer layer on the lower substrate, and defining a plurality of through- holes along the sealing area;
    forming a display unit at the display area;
    forming a metal pattern layer, in which a plurality of through-portions are patterned, along the sealing area;
    forming a first metal layer at an edge portion of the display unit and spaced from the metal pattern layer;
    forming a plurality of metal patterns at the sealing area outside of the display area, each of the metal patterns having an island shape that is entirely surrounded by one or more interlayer insulating films both in a plan view and in a cross-sectional view, at least one of the interlayer insulating films being between the metal pattern layer and the first metal layer;
    forming a sealing member at the sealing area; and
    adhering an upper substrate to the lower substrate using the sealing member,
    wherein at least a portion of the sealing member is in contact with the lower substrate through the plurality of through-holes formed in the buffer layer and through the plurality of through-portions formed in the metal pattern layer.

2. The method of claim 1, wherein the forming of the metal pattern layer and the forming of the first metal layer are concurrent.

3. The method of claim 1, wherein the forming of the plurality of metal patterns and the forming of the first metal layer are concurrent.

4. The method of claim 1, further comprising forming an electrode power supply line on the first metal layer to overlap the plurality of metal patterns and the first metal layer,
    wherein the forming of the display unit comprises:
        forming a thin-film transistor (TFT);
        forming a pixel electrode that is electrically connected to the TFT; and
        forming a counter electrode, which faces the pixel electrode and contacts the counter electrode, over an entire surface of the display unit.

5. The method of claim 4, wherein the electrode power supply line does not overlap the metal pattern layer.

6. A method of manufacturing an organic light-emitting display apparatus, the method comprising:
    preparing a lower substrate having a display area, and a sealing area outside of the display area;
    forming a display unit at the display area;
    forming a metal pattern layer, in which a plurality of through-portions are patterned, along the sealing area;
    forming a first metal layer at an edge portion of the display unit and spaced from the metal pattern layer;
    forming a plurality of metal patterns between the metal pattern layer and the first metal layer;
    forming a sealing member at the sealing area;
    adhering an upper substrate to the lower substrate using the sealing member;
    forming an electrode power supply line on the first metal layer to overlap the plurality of metal patterns and the first metal layer,
    wherein the forming of the display unit comprises:
        forming a thin-film transistor (TFT);
        forming a pixel electrode that is electrically connected to the TFT; and
        forming a counter electrode, which faces the pixel electrode and contacts the counter electrode, over an entire surface of the display unit; and
    forming a second metal layer between the forming of the first metal layer and the forming of the electrode power supply line such that the second metal layer overlaps at least a part of the first metal layer and overlaps at least some of the plurality of metal patterns.

7. The method of claim 6, wherein the forming of the metal pattern layer and the forming of the second metal layer are concurrent.

8. The method of claim 6, wherein remaining ones of the plurality of metal patterns, which are other than the at least some of the plurality of metal patterns that overlap the second metal layer, are formed at a same layer as the second metal layer.

9. The method of claim 6, wherein the metal pattern layer and the first metal layer are spaced from each other by a first interval,
    wherein the metal pattern layer and the second metal layer are spaced from each other by a second interval that is less than the first interval, and
    wherein the metal pattern layer and the electrode power supply line are spaced from each other by a third interval that is less than the second interval.

* * * * *